United States Patent
Alessandria et al.

(10) Patent No.: US 9,564,541 B2
(45) Date of Patent: Feb. 7, 2017

(54) DIODE WITH INSULATED ANODE REGIONS

(71) Applicant: STMICROELECTRONICS S.R.L., Agrate Brianza (IT)

(72) Inventors: Antonino Alessandria, Catania (IT); Leonardo Fragapane, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/943,794

(22) Filed: Nov. 17, 2015

(65) Prior Publication Data

US 2016/0071984 A1    Mar. 10, 2016

Related U.S. Application Data

(62) Division of application No. 14/656,331, filed on Mar. 12, 2015.

(51) Int. Cl.

| | |
|---|---|
| *H01L 29/66* | (2006.01) |
| *H01L 29/868* | (2006.01) |
| *H01L 29/78* | (2006.01) |
| *H01L 27/06* | (2006.01) |
| *H01L 27/07* | (2006.01) |
| *H01L 27/08* | (2006.01) |

(Continued)

(52) U.S. Cl.
CPC ......... *H01L 29/868* (2013.01); *H01L 27/0629* (2013.01); *H01L 27/0664* (2013.01); *H01L 27/0694* (2013.01); *H01L 27/0727* (2013.01); *H01L 27/0814* (2013.01); *H01L 29/0692* (2013.01); *H01L 29/36* (2013.01); *H01L 29/43* (2013.01); *H01L 29/66136* (2013.01); *H01L 29/7804* (2013.01)

(58) Field of Classification Search
CPC .............. H01L 29/868; H01L 29/0692; H01L 29/66136; H01L 29/7804; H01L 27/0664; H01L 27/0694; H01L 27/0727; H01L 27/0629; H01L 27/0814
See application file for complete search history.

(56) References Cited

U.S. PATENT DOCUMENTS 5,371,040 A * 12/1994 Graff .................... H01L 21/221
                                                        148/DIG. 23
5,859,446 A    1/1999 Nagasu et al.
(Continued)

FOREIGN PATENT DOCUMENTS

JP    H10326900 A    12/1998

*Primary Examiner* — Trung Q Dang
*Assistant Examiner* — Wasiul Haider
(74) *Attorney, Agent, or Firm* — Seed IP Law Group LLP

(57) ABSTRACT

A diode is integrated on a semiconductor chip having anode and cathode surfaces opposite to each other. The diode comprises a cathode region extending inwardly from the cathode surface, a drift region extending between the anode surface and the cathode region, and a plurality of anode regions extending from the anode surface in the drift region. The diode further comprises a cathode electrode coupled with the cathode region, and an anode electrode that contacts one or more contacted anode regions of said anode regions and is electrically insulated from one or more floating anode regions of the anode regions. The diode is configured so that charge carriers are injected from the floating anode regions into the drift region in response to applying of a control voltage exceeding a threshold voltage.

20 Claims, 6 Drawing Sheets

(51) Int. Cl.
*H01L 29/06* (2006.01)
*H01L 29/36* (2006.01)
*H01L 29/43* (2006.01)

(56) References Cited

U.S. PATENT DOCUMENTS

| | | | |
|---|---|---|---|
| 6,580,150 B1* | 6/2003 | Metzler | H01L 21/3086 |
| | | | 257/287 |
| 2003/0160262 A1 | 8/2003 | Kitada et al. | |
| 2007/0200138 A1* | 8/2007 | Ozeki | H01L 27/0611 |
| | | | 257/139 |
| 2009/0194838 A1 | 8/2009 | Pendharkar et al. | |
| 2009/0289276 A1 | 11/2009 | Yoshiura et al. | |
| 2009/0294891 A1* | 12/2009 | Niwa | H01L 29/0619 |
| | | | 257/488 |
| 2013/0001639 A1 | 1/2013 | Iwasaki et al. | |
| 2015/0144995 A1 | 5/2015 | Takahashi | |

* cited by examiner

DIODE WITH INSULATED ANODE REGIONS

BACKGROUND

Technical Field

The present disclosure relates to the field of electronics. In greater detail, the present disclosure relates to a diode.

Description of the Related Art

Diodes are electronic components widely used in various electronic circuits. For example, in the field of power electronics diodes (also referred to as high voltage diodes) are used for implementing rectifier circuits and protection circuits. For example, a particular application of diodes in the power electronics field is in switching mode power supplies (SMPS), such as flyback, buck, boost converters, etc., which are used to supply energy to circuits of various types (e.g., from data processing circuits to LED lighting systems); switching power supplies have a high efficiency and compactness compared with, for example, the classic power supplies simply comprising a ferromagnetic transformer.

Switching power supplies provide current and voltage at well-defined and stable values from a supply voltage (e.g., a main voltage) thanks to a high frequency switching (in the order of hundreds of KHz) between two or more operating conditions (e.g., an energy storing condition and an energy supplying condition). In particular, the energy conversion efficiency of the switching power supply increases with the switching frequency thereof. For this reason, in the art there is a continuous tendency to increase the switching frequency of the switching power supplies.

Therefore, the diodes used in switching power supplies (or more generally in any power electronics applications such as in insulated gate bipolar transistors (IGBT), power MOSFETs and thyristors) should be able to operate properly and with high performance at high frequencies.

Among high voltage diodes, the most widespread type is that known as PiN; a PiN diode comprises an anode region (P) of semiconductor material with p-type doping and a cathode region (N) of semiconductor material with n-type doping, between which a drift region (i) of semiconductor material with a weak n-type doping (lower than the n-type doping of the cathode) is interposed. Theoretically, the intermediate region of PiN diodes is an undoped intrinsic semiconductor region, hence the designation PiN, but PiN diodes are typically made using weak n-type doping in the intermediate/drift region. The drift region allows a correct operation even with high potential differences applied to the ends of the PiN diode (e.g., in the order of hundreds of Volts). In order to operate with high current intensity (e.g., in the order of tens of Amperes) the PiN diode is generally provided with a cellular-type structure with a plurality of anode regions electrically coupled but spaced apart one from the other.

The PiN diodes may have sub-optimal reverse recovery performance. In fact, when a control voltage of a PiN diode is switched from a forward biasing value to a shutdown or reverse biasing value, the charge carriers (electrons and holes) inside the drift region should be removed before the diode prevents a flow of electric current. This has a negative effect on a maximum switching frequency achievable by the PiN diode.

In order to increase the removal speed of the charge carriers of the PiN diodes (and hence the reverse recovery performance), in the art various changes to their structure have been proposed. In general, the known changes are based on introductions of recombination centers for the charge carriers in the drift region (called lifetime killing technique) and/or on variation of the structure of the anode and/or the cathode, e.g., buffer, Hybrid or ECPT (Collector Emitter Punch-Through) cathode structures and/or SSD (Static Shielding diode), MPS (Merged PiN Schottky diode), Speed (Self-Adjusting P-Emitter Efficiency diode), SFD (Soft and Fast Diode), ESD (Short Emitter Diode) and CIC (Charge Injection Control) anode structures.

However, the introduction of recombination centers generally increases leakage currents due to non-ideality of the PiN diodes. The solutions that modify the cathode structure generally increase a peak intensity of a reverse current generated during the reverse recovery phase. Finally, the solutions that modify the anode structure generally increase a threshold voltage required to activate the PiN diodes.

BRIEF SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not be understood as an indication of its key elements nor as a delimitation of its scope.

In general terms, the present disclosure is based on the idea of insulating part of the anode regions.

In particular, an aspect of the present disclosure provides a diode, in which one or more anode regions are electrically coupled with an anode electrode, and one or more anode regions are electrically insulated therefrom.

Another aspect provides an electronic device comprising at least one diode mentioned above and at least one power transistor integrated on a same chip.

A different aspect provides an electronic apparatus comprising at least one electronic device mentioned above.

A further aspect provides a method of integrating such diode on a chip of semiconductor material.

In particular, one or more aspects of the present disclosure are set out in the independent claims and advantageous features thereof are set out in the dependent claims, with the wording of all the claims that is herein incorporated verbatim by reference (with any advantageous features provided with reference to a specific aspect that apply mutatis mutandis at any other aspect).

BRIEF DESCRIPTION OF THE SEVERAL VIEWS OF THE DRAWINGS

The solution of the present disclosure, as well as additional features and its advantages, will be better understood with reference to the following detailed description, given purely by way of indication and without limitation, to be read in conjunction with the attached figures (wherein corresponding elements are denoted with equal or similar references and their explanation is not repeated for the sake of brevity). In this respect, it is expressly intended that the figures are not necessarily to scale (with some details that may be exaggerated and/or simplified) and that, unless otherwise indicated, they are simply used to conceptually illustrate the described structures and procedures. In particular.

DETAILED DESCRIPTION

Figure 1:
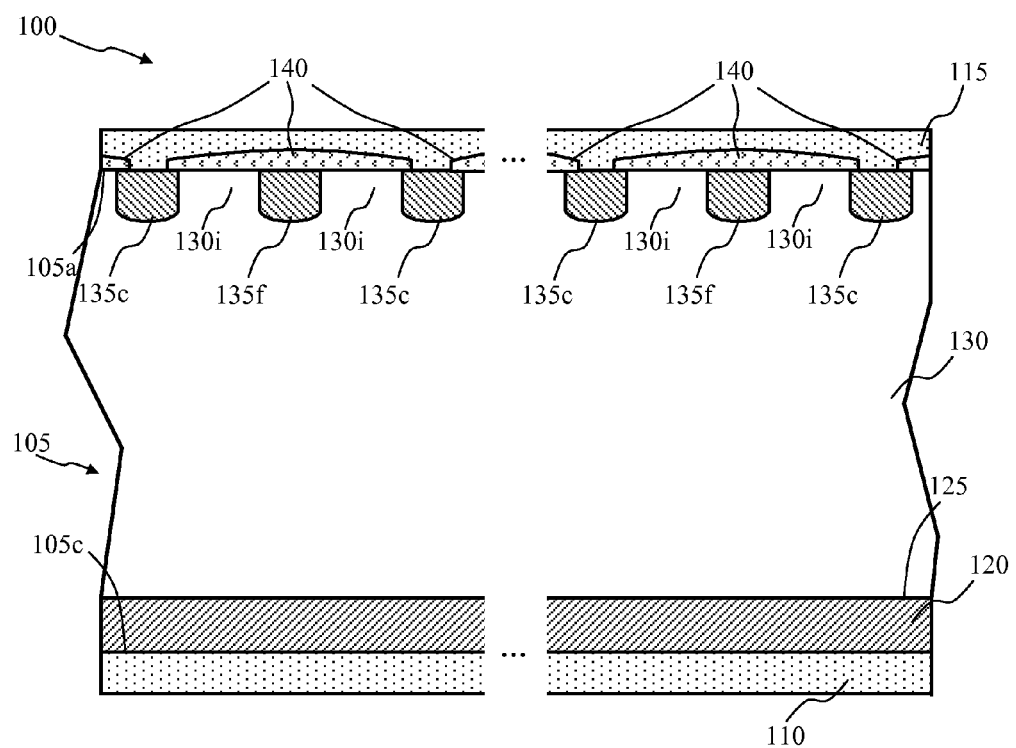
FIG. 1 shows a schematic cross-section side view of a PiN diode according to an embodiment of the present disclosure.

With reference to FIG. 1, it illustrates a schematic cross-section side view of a PiN diode 100 according to an embodiment of the present disclosure.

The PiN diode 100 (e.g., for power applications) is integrated on a chip of semiconductor material 105, such as silicon Si; the chip 105 has two (main) surfaces opposite to each other, indicated as cathode (lower) surface 105c and as anode (upper) surface 105a. The diode has a cathode electrode 110 and an anode electrode 115 of electrically conductive material (e.g., one or more layers of metallic and/or heavily doped semiconductor material).

The PiN diode 100 comprises a cathode region 120 (or more) having an n-type doping (e.g., silicon doped with phosphorus P). The cathode region 120 extends from the cathode surface 105c toward the inside of the chip 105. The cathode region 120 is electrically coupled with the cathode electrode 110 on the cathode surface 105c.

An drift region 130 extends in the chip 105 between the cathode region 120 and the anode surface 105a. The drift region 130 has a doping similar to the doping of the cathode region, i.e., of the same n-type, but with a concentration of dopants (namely, a number of phosphorus atoms compared with the silicon atoms) lower than a dopant concentration of the cathode region 120. For example, the doping of the drift region 130 is equal to $10^{-10}$-$10^{-3}$ times, preferably equal to $10^{-9}$-$10^{-4}$ times, and still more preferably equal to $10^{-8}$-$10^{-5}$ times, such as equal to $10^{-6}$ times, the doping of the cathode region 120; for example, the doping of the drift region 130 is in the order of $10^{13}$ carriers/cm$^3$ and the doping of the cathode region 120 is in the order to $10^{19}$ carriers/cm$^3$.

A plurality of anode regions 135 extends from the anode surface 105a in the chip 105.

The anode regions 135 are formed of semiconductor material having a doping of the opposite type with respect to the doping of the cathode region 120, i.e., p-type (such as silicon doped with boron B, e.g., with a concentration of $10^{15}$-$10^{17}$ carriers/cm$^3$).

In the solution according to an embodiment of the present disclosure, a subset of (one or more) anode regions 135 (referred to as contacted anode regions 135c) is electrically coupled with the anode electrode 115 on the anode surface 105a (as usual); however, another (remaining) subset of (one or more) anode regions 135 (referred to as floating anode regions 135f) is electrically insulated from the anode electrode 115. In particular, in the specific embodiment shown in the figure, each floating anode region 135f is interposed between a pair of adjacent contacted anode regions 135c.

For example, the anode surface 105a is covered by an insulating layer 140 made of an electrically insulating material (e.g., silicon oxide). The insulating layer 140 is interposed between the anode surface 105a and the anode electrode 115 in correspondence to the floating anode regions 135f, while contact windows (for the anode electrode 115) are opened in the insulating layer 140 in correspondence to the contacted anode regions 135c. In this way, the floating anode regions 135f (and the drift region 130) are insulated from the anode electrode 115.

The PiN diode 100 is configured in such a way that, when a control electric voltage, applied between the anode electrode 105a and the cathode electrode 105c, has a positive value (forward voltage Vd) that exceeds a threshold voltage of the diode PiN 100 (e.g., in the order of some Volts, for example, 0.8-5.0 V, preferably 0.8-2.5 V, and even more preferably 0.8-2.0V), the charge carriers (holes) comprised in the floating anode regions 135f are injected from the latter into the drift region 130. Such injection of the holes from the floating anode regions 135f in the drift region 130 occurs in response to the reaching of the floating anode regions 135f by an electric field E generated between the contacted anode regions 135c and the cathode region 120 by the application of the forward voltage Vd.

For this purpose each floating anode region 135f is spaced apart on the anode surface 105a from each adjacent contacted anode region 135c at most by 1-30 μm, preferably 1-20 μm, and even more preferably 0.5-10 μm, such as 5 μm.

In this way, in the drift region 130 the holes injected from the floating anode regions 135f are added to the holes injected (as it is known) from the contacted anode regions 135c, thereby obtaining a higher hole concentration (compared to a known PiN diode). This, for the same voltage Vd, increases the intensity of a corresponding current of the PiN diode (also a positive one, or forward current Id). All this has a positive effect on the efficiency of the PiN diode 100 during a forward operation thereof.

In addition, it also improves the reverse recovery performance of the PiN diode 100; this result is obtained without (or with limited) increase of leakage currents, increase of peak intensity of a reverse current generated during the reverse recovery phase and increase of the threshold voltage.

All this has a positive effect on a maximum switching frequency reachable by the PiN diode 100, so that it is particularly advantageous in switching mode power supplies.

Figure 2:
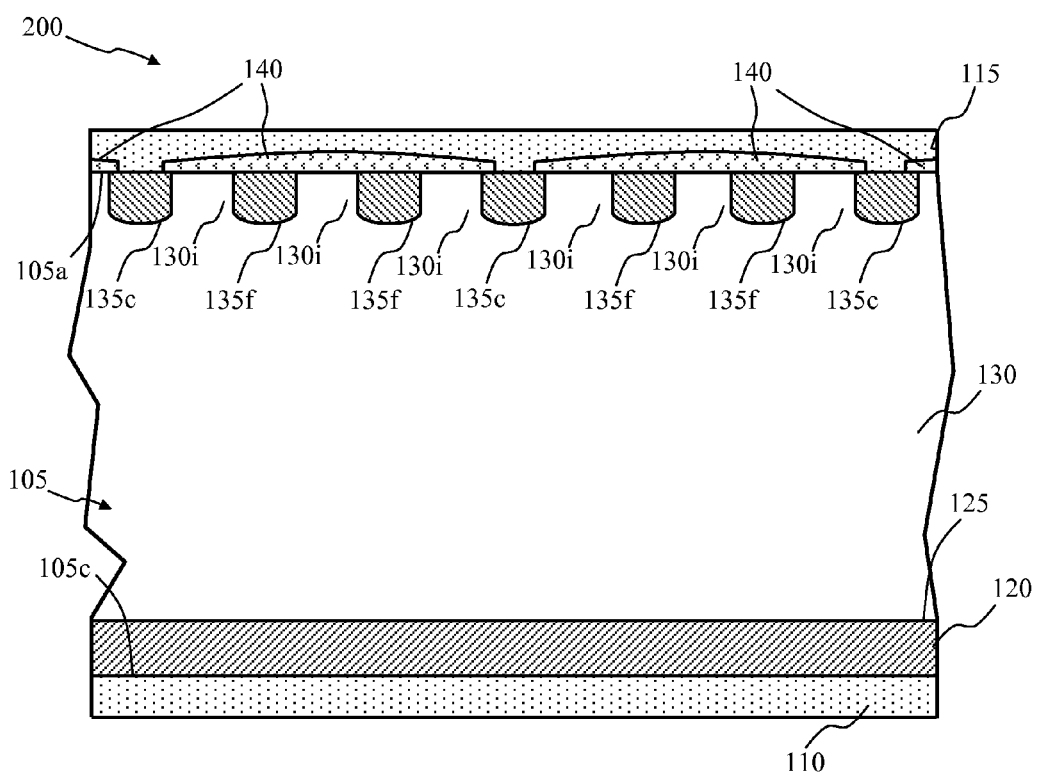
FIG. 2 shows a schematic cross-section side view of a PiN diode according to another embodiment of the present disclosure.

Turning to FIG. 2, it illustrates a schematic cross-section side view of a PiN diode 200 according to another embodiment of the present disclosure.

The PiN diode 200 differs from the PiN diode just described in what follows.

In the PiN diode 200, a plurality of floating anode regions 135f, two in the example at issue, is formed between each pair of adjacent contacted anode regions 135c.

The structure described above allows injecting an even greater number of holes from the floating anode regions 135f into the drift region 130 for the same value of the forward voltage Vd (compared to the previous case).

It should be noted however that as the number of floating anode regions 135f between each pair of contacted anode regions 135c increases a value of a breakdown voltage Vb of the diode decreases. For example, a breakdown voltage Vb exceeding 1.2-2.5 kV is obtained with a number of floating anode regions 135f between each pair of contacted anode regions 135c *lower than* 4-5.

Figure 3:
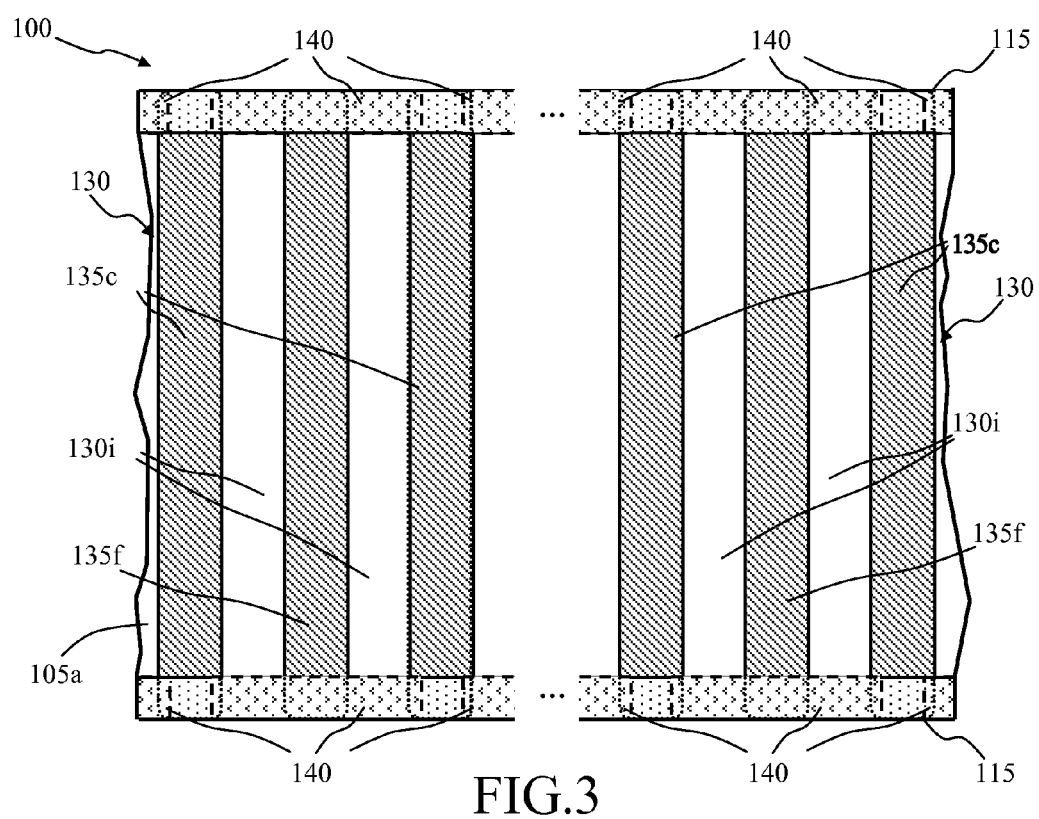
FIG. 3 shows a schematic top plan view of a PiN diode according to an embodiment of the present disclosure.

Considering now FIG. 3, it illustrates a schematic top plan view of the PiN diode 100 according to an embodiment of the present disclosure.

In detail, the anode regions 135 are shaped as substantially parallel stripes on the surface 115. Preferably, each anode region 135 has a longitudinal extent y substantially greater than a transversal extent x. For example, a ratio between the longitudinal extent y and the transversal extent x is greater than 10-200, such as equal to 50.

Furthermore, the anode electrode 115 has a structure of perimetral-type, i.e., it is shaped substantially as a frame, disposed in such a way to surround (in plan) the anode regions 135c, 135f and to surmount opposite ends of each of them (with the ends of each floating anode region 135f that are insulated from the anode electrode 115 that surmounts them through the insulating layer 140 and with the ends of each contacted anode region 135c that are electrically coupled with the anode electrode 115 by means of corresponding windows opened in the insulating layer 140).

This has a positive effect on the operation of the PiN diode 100. Indeed, the contact between the anode electrode 115 at the opposite ends of each contacted anode region 135c ensures a more homogeneous distribution of the forward current Id along the length of the contacted anode regions 135c and the floating anode regions 135f.

In addition, thanks to the structure described above, the electric field E is more uniform as well.

Similar considerations apply when this configuration is applied to the structure of FIG. 2 (not shown in the figures), so that two or more strips of floating anode regions are interposed between each pair of strips of adjacent contacted anode regions.

Figure 4:
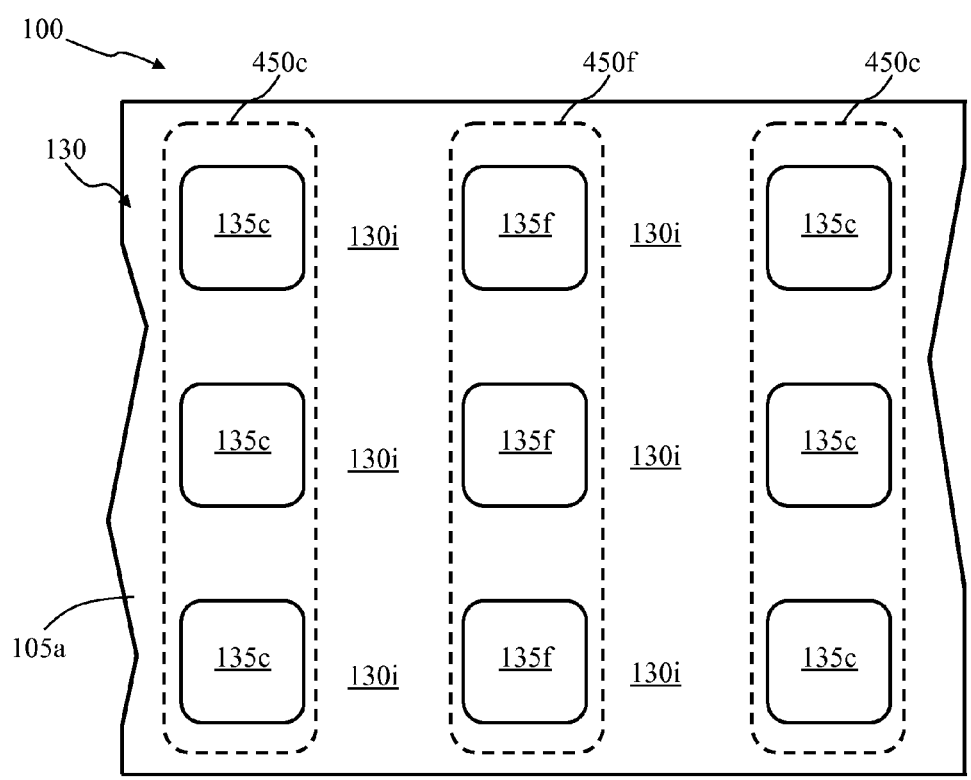
FIG. 4 shows a schematic top plan view of a PiN diode according to a further embodiment of the present disclosure.

Considering FIG. 4, it illustrates a schematic top plan view of the PiN diode 100 according to a further embodiment of the present disclosure.

In this case, the anode regions 135 are formed substantially with an "island" structure on the anode surface 105a. In other words, each anode region 135c has a longitudinal extent y' substantially equal to a lateral extent x'. For example, a ratio between the longitudinal extent y' and the lateral extent x' is lower than 2-5, such as, for example, equal to 1.

Preferably, the anode regions 135c, 135f are arranged on the anode surface 105a with a matrix arrangement (i.e., in rows and columns).

In the embodiment shown in the figure, the floating anode regions 135f and the contacted anode regions 135c are arranged along corresponding alignments 450f and 450c, respectively (e.g., columns of the matrix). Each alignment 450f of floating anode regions 135f is comprised between a pair of adjacent alignments 450c of the contacted anode regions 135c.

In this way, the same benefits as described above may be obtained even if the anode regions 135 are formed with an island structure.

Similar considerations apply when such configuration is applied to the structure of FIG. 2 (not shown in the figures), so that two or more arrays of floating anode regions are comprised between each pair of arrays of adjacent contacted anode regions as above.

Figure 5:
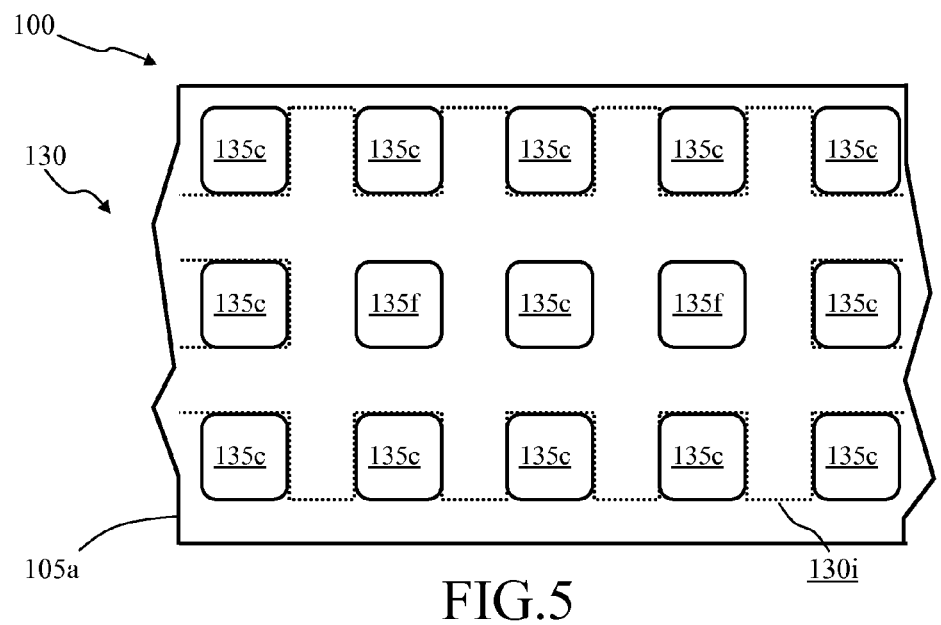
FIG. 5 shows a schematic top plan view of a PiN diode according to another further embodiment of the present disclosure.

Turning to FIG. 5, it illustrates a schematic top plan view of the PiN diode 100 according to another further embodiment of the present disclosure.

As above, the anode regions 135 are arranged on the anode surface 105a with a matrix arrangement. However, in this case each floating anode region 135f is surrounded on the anode surface 105a by a plurality of contacted anode regions 135c. For example, each floating anode region 135f is comprised between respective pairs of adjacent contacted anode regions 135c arranged along the longitudinal direction, along the transversal direction and along the diagonal directions (transverse to each other) on the anode surface 105a.

In this way, it is possible to obtain a greater uniformity of the electric field E which extends in the floating anode regions 135f surrounded by the contacted anode regions 135c, thereby obtaining a greater hole injection efficiency.

Similar considerations apply when this configuration is applied to the structure of FIG. 2 (not shown in the figures), so that the floating anode regions are organized into sets each of two or more floating anode regions; each set of floating anode regions is surrounded by a plurality of contacted anode regions.

Figure 6:
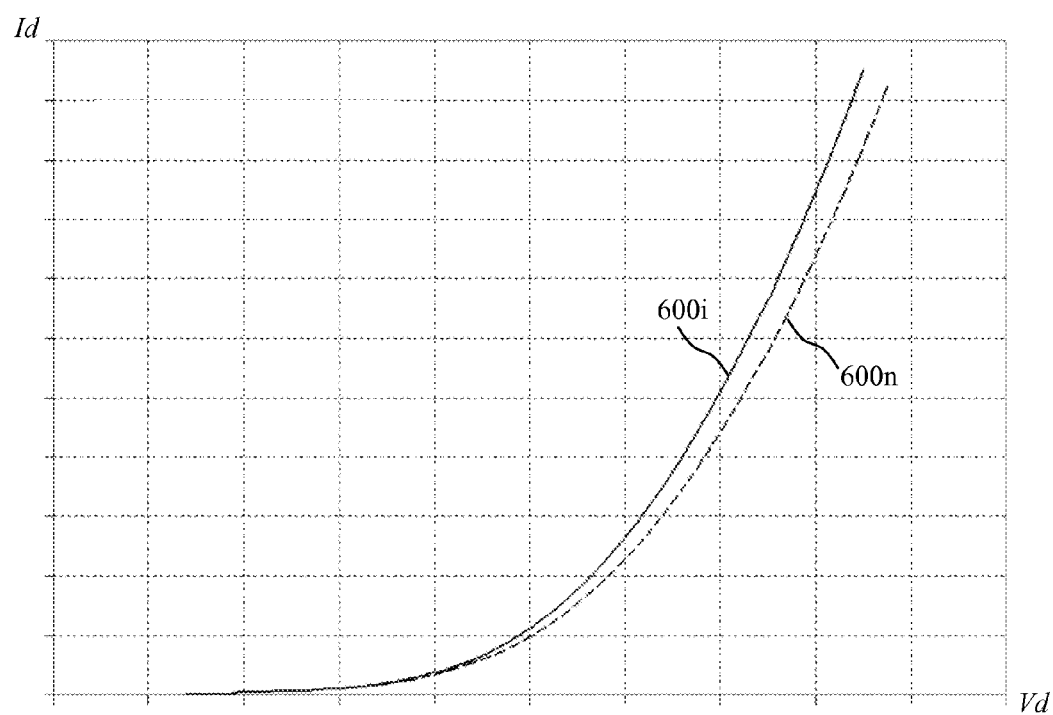
FIG. 6 shows a qualitative graph of a trend of the current/voltage relationship in the PiN diode according to an embodiment of the present disclosure.

With reference now to FIG. 6, it illustrates a qualitative graph that plots the forward current Id of the diode (on the ordinate axis) as a function of the forward voltage Vd applied between its anode and cathode electrodes (on the abscissa axis), or Id/Vd characteristic; in particular, a curve 600i represents the trend of the (forward) current/voltage relationship in the PiN diode according to an embodiment of the present disclosure, while a curve 600n represents the trend of the current/voltage relationship in a PiN diode known in the art (with the same anode regions being all contacted). As mentioned above, the PiN diode according to an embodiment of the present disclosure allows obtaining a forward current Id (represented by the curve 600i) of higher intensity for the same voltage Vd compared to the known PiN diode (represented by the curve 600n).

Figure 7:
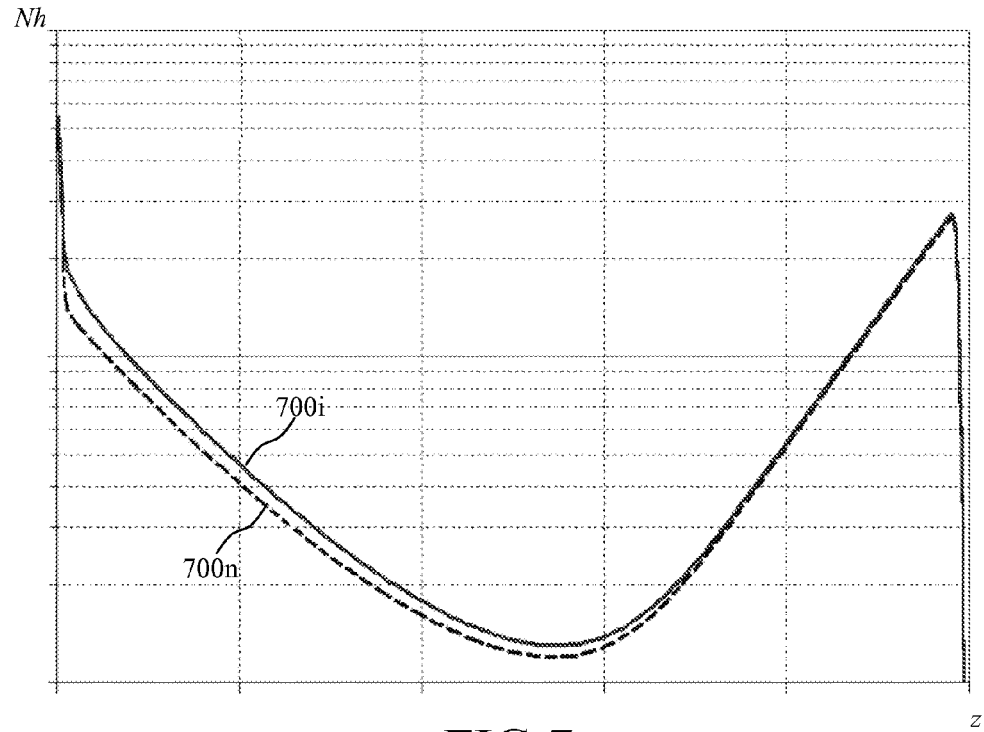
FIG. 7 shows a qualitative graph of a concentration of minority carriers in the PiN diode according to an embodiment of the present disclosure.

Similarly, FIG. 7 illustrates a qualitative graph that plots a concentration of minority carriers Nh in the drift region (on the ordinate axis) as a function of the depth z therein (on the abscissa axis); in particular, a curve 700i represents the trend of the concentration in the PiN diode according to an embodiment of the present disclosure, whereas a curve 700n represents the trend of the concentration in a PiN diode known in the art (with the same anode regions being all contacted) during the forward operation. As it may be appreciated, the concentration in the PiN diode according to an embodiment of the present disclosure (represented by the curve 700i) is substantially greater than the concentration in the PiN diode known in the art (represented by the curve 700n), in particular starting from the anode surface 105a toward the cathode surface 105c for a predominant portion of the drift region 130. Such increased concentration allows obtaining the benefits relating to the Id/Vd characteristic mentioned above.

Figure 8:
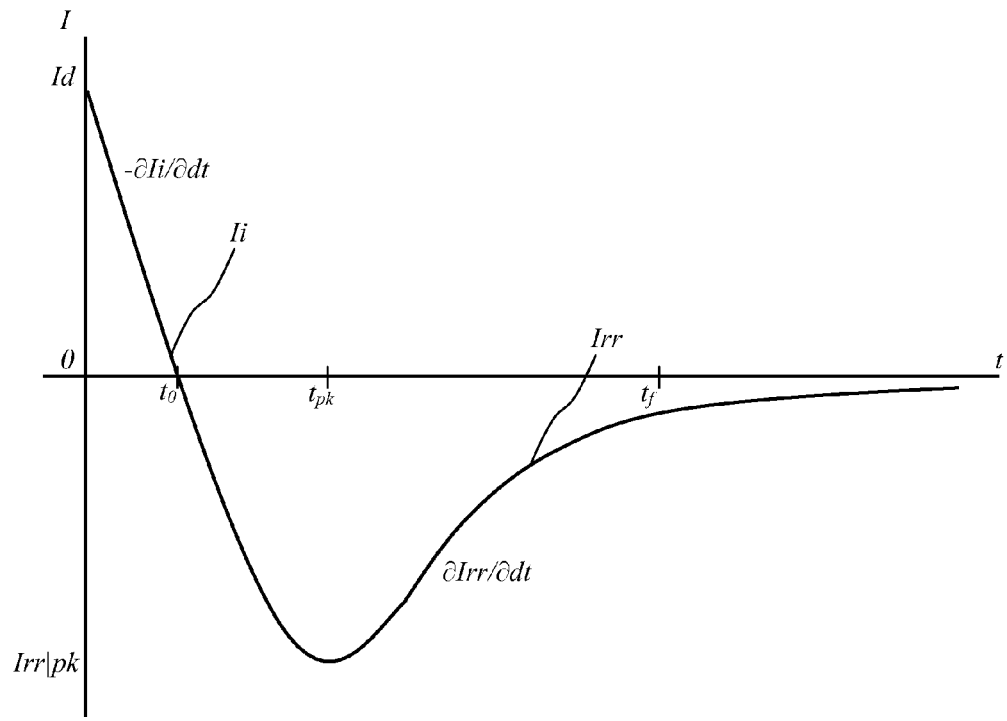
FIG. 8 shows a qualitative graph of a trend of an electric current in a switching phase in the structure of the PiN diode according to an embodiment of the present disclosure.

With reference to FIG. 8, it illustrates a qualitative graph of a trend of the electric current in a switching phase in the PiN diode according to an embodiment of the present disclosure.

In particular, the figure shows a qualitative graph that plots the current I of the diode (on the ordinate axis) as a function of time t (on the abscissa axis), starting from an instant in which the control voltage of the diode (i.e., the voltage applied between its electrodes) is switched from a value higher than the threshold voltage (forward biased diode) to a value lower than it (reverse biased diode).

As it is known, at the beginning of the switching the current I (being positive, i.e., the forward current Id) starts to decrease, and then it reverses (indicated as reverse current $I_r$) down to reach an intensity peak $I_{rr|pk}$ (due to the residual charge carriers, both electrons and holes, comprised in the drift region at the beginning of the switching phase). The current I then decreases in absolute value (referred to as recombination current Irr at this stage) up to zero at the end of the switching (as a result of the recombination of the residual charge carriers).

In an embodiment according to the present disclosure, the improvement of the Id/Vd characteristic described above is exploited to improve the switching performance of the PiN diode.

For example, the improvement of the Id/Vd characteristic may be exploited to cancel, or at least mitigate, the disadvantages connected to an application of techniques for the reduction of the life time (lifetime killing) of the charge carriers within the drift region of the PiN diode commonly used to reduce the peak intensity $I_{rr|pk}$.

For this purpose, a plurality of charge recombination centers (not shown) is provided in the drift region of the PiN diode (e.g., a concentration of the charge recombination centers is preferably greater than or equal to $10^{12}$-$10^{16}$ centers/cm$^3$, preferably $5 \times 10^{12}$-$5 \times 10^{14}$ centres/cm$^3$, such as $10^{13}$ centres/cm$^3$). The charge recombination centers may be formed by a doping with impurities (e.g., gold Au or platinum Pt atoms) in the drift region, or by the generation of defects in the crystalline structure of the drift region (e.g., through irradiation with an electron beam or electromagnetic radiations, such as γ-rays).

The charge recombination centers have the effect of increasing a recombination rate between the charge carriers of opposite polarity (i.e., electrons and holes) within the drift region. Consequently, a net number of charge carriers that need to be recombined by the recombination current $I_{rr}$ during the switching phase is reduced, as a function of the concentration of the charge recombination centers (e.g., reduced by a percentage greater than or equal to 2-20%, preferably 4-15%, and even more preferably 7-13%, such as 10%).

This allows attenuating the peak intensity $I_{rr|pk}$. This also involves a general reduction of the negative slope of the variation of the reverse current Ii over time (i.e., $-dI_i/dt$) between an instant $t_0$ in which the current $I_i$ is canceled and an instant $t_{pk}$ in which the reverse current $I_{rr}$ reaches the peak intensity $I_{rr|pk}$ and also a positive slope of the variation of the recombination current $I_{rr}$ (i.e., $dI_{rr}/dt$) between the instant $t_{pk}$ and a switching final instant $t_f$.

However, the addition of the charge recombination centers increases the intensity of leakage currents in the PiN diode due to a recombination of the charge carriers that contribute to the forward current Id during the forward operation of the PiN diode.

In the PiN diode according to embodiments of the present disclosure, it is possible to cancel, or at least substantially mitigate, the negative effect due to the increase of intensity of the leakage currents.

In fact, the increase of the forward current Id made possible thanks to the presence of the floating anode regions allows compensating, at least partially (or even exceeding) the leakage current caused by the addition of the charge recombination centers. In this way, it is possible to add the charge recombination centers (with the advantages described above) and still obtain the same forward current Id (for the same voltage Vd) of the PiN diodes known in the art. In this way it is possible to obtain a positive effect on the switching frequency capability of the PiN diode, thereby improving its efficiency.

In addition or alternatively, it is also possible (in order to further increase the removal speed of the charge carriers) to provide the cathode region with a cathode buffer structure, a cathode hybrid structure and/or an Emitter-Collector Punch-Through (ECPT) cathode structure and/or part of the (both contact and floating) anode regions with a Static Shielding Diode (SSD) anode structure, a Merged PiN Schottky diode (MPS) anode structure, a Self-adjusting P-emitter Efficiency Diode (SPEED) anode structure, a Soft and Fast Diode (SFD) anode structure, an Emitter Short Diode (ESD) anode structure and/or a Charge Injection Control (CIC) anode structure.

The PiN diode according to embodiments of the present disclosure is adapted to be integrated together with other electronic components (not shown) on a same chip of semiconductor material in order to provide a complex integrated electronic device. For example, the PiN diode may be integrated in parallel to a power transistor (such as a MOSFET transistor) in order to ensure a correct operation of the latter during the rapid changes in voltage at its terminals (for example, suitable for the use in switching power supplies).

Additionally, one or more PiN diodes according to embodiments of the present disclosure and/or the power transistor comprising a PiN diode also lend themselves to be implemented in power equipments such as diode bridges for rectifying oscillating voltages and/or Switching Mode Power Supplies (SMPS) such as buck, boost or flyback converters.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms comprising, including, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, a diode is proposed. The diode is integrated on a chip of semiconductor material having an anode surface and a cathode surface opposite to each other. The diode comprises at least one cathode region having a doping of a first type, with the cathode region that extends from the cathode surface in the chip. Furthermore, the diode comprises a drift region having a doping of the first type with a dopant concentration lower than a dopant concentration of the cathode region; such drift region extends between the anode surface and the cathode region. In addition, the diode comprises a plurality of anode regions having a doping of a second type, with each anode region that extends from the anode surface in the drift region. The diode further comprises a cathode electrode of electrically conductive material electrically coupled with said at least one cathode region on the cathode surface, and an anode electrode of electrically conducting material. One or more contacted anode regions of said anode regions are electrically coupled with the anode electrode on the anode surface, and one or more floating anode regions of said anode regions are electrically insulated from the anode electrode. The diode is configured so that charge carriers are injected from said at least one floating anode region into the drift region in response to the applying of a control voltage between the anode electrode and the cathode electrode exceeding a threshold voltage of the diode.

However, the diode may be of any type (also not PiN) and may work with any voltage and current values (even at low power); the anode, cathode and drift regions may be in any number, of any type (standard or not), with any shape (see below), size and doping (in terms both of type of impurities and of their relative and absolute amount); similarly, the anode and cathode electrodes may be of any type, material and number (also different from the number of anode and cathode regions, respectively). The cathode region and the contacted anode regions may be coupled with the cathode and anode electrode, respectively, in any way (either directly or indirectly, for example, via conductive paths), and the floating anode regions may be insulated from the anode electrode in any way (e.g., by means of corresponding insulating elements). The floating and contacted anode regions may be in any number (equal to or different from each other) and arranged in any manner (see below).

In an embodiment, the drift region comprises a plurality of charge recombination centers adapted to recombine free charge carriers.

However, the charge recombination centers may be of any type, in any number, size and position. In any case, an implementation without such recombination centers (for example, to obtain a greater forward current for the same forward voltage) is not excluded.

In an embodiment, the anode regions are shaped in strips parallel to each other on the anode surface.

Anyway, the strips may have any size and arrangement; For example, nothing prevents from forming a plurality of clusters of parallel stripes, with such clusters formed transversally to each other.

In an embodiment, the floating anode regions are organized into sets each of one or more floating anode regions; each set of floating anode regions is comprised on the anode surface between each pair of adjacent contacted anode regions.

However, each set may comprise any number of floating anode regions; in any case, nothing prevents arranging the anode regions in another way (for example, with additional contacted anode regions adjacent to the contacted anode regions of each pair).

In an embodiment, the anode regions are arranged in a matrix on the anode surface.

However, the matrix may have any number of rows and columns (either equal or different one from the other). In any case, the anode regions may be arranged in any other way (for example, divided into a plurality of clusters, in which the anode regions are arranged in different strips or matrices).

In an embodiment, the floating anode regions are organized into sets each of one or more floating anode regions; each set of floating anode regions is surrounded along a plurality of directions on the anode surface by a plurality of contacted anode regions.

However, each set may comprise any number of floating anode regions and may be surrounded by the contacted anode regions along any number (two or more) of directions; in any case, nothing prevents the sets of floating anode regions from being surrounded by the plurality of contacted anode regions with solution of continuity. Alternatively, the contacted anode regions and the floating anode regions are formed in alternate positions along both the rows and the columns of the matrix formed by them on the anode surface.

In an embodiment, the contacted anode regions and the floating anode regions are arranged on the anode surface along corresponding alignments parallel to each other. The alignments of the floating anode regions are arranged in sets each of one or more alignments; each set of alignments of the floating anode regions on the anode surface is comprised between each pair of adjacent alignments of the contacted anode regions.

However, each set may comprise any number of alignments of the floating anode regions; in any case, nothing prevents forming a plurality of clusters each comprising sets of alignments of floating anode regions and the corresponding alignments of contacted anode regions, each cluster being disposed transversally to one or more of the remaining clusters on the anode surface.

Moreover, the proposed solution might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages.

A different aspect proposes an electronic device comprising at least one diode, and at least one power transistor integrated on said chip; each diode is operatively coupled with a respective power transistor.

However, the electronic device may comprise any number of diodes and power transistors. In any case, it is possible to provide an electronic component different from a transistor (e.g., a thyristor). In addition, nothing prevents integrating only the diode (or diodes) on the chip.

A different aspect provides an electronic apparatus comprising at least one electronic device mentioned above.

However, the electronic apparatus may comprise any number of electronic devices; Moreover, this electronic apparatus may be used in any application (for example, even not of the power type).

Generally, similar considerations apply if the diode, the electronic device and the electronic apparatus each has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. It should also be noted that (unless specified otherwise) any interaction between different components generally does not need to be continuous, and it may be either direct or indirect through one or more intermediaries.

A further aspect provides a method of integrating a diode on a chip of semiconductor material having an anode surface and a cathode surface opposite to each other. The method comprising the following steps. At least one cathode region having a doping of a first type is formed; the cathode region extends from the cathode surface in the chip thereby defining an drift region having a doping of the first type with a dopant concentration lower than a dopant concentration of the cathode region (with the drift region extending between the anode surface and the cathode region). A plurality of anode regions having a doping of a second type is formed; each anode region extends from the anode surface in the drift region. A cathode electrode of electrically conductive material is formed electrically coupled with the at least one cathode region on the cathode surface. An anode electrode of electrically conducting material is formed. The step of forming an anode electrode comprises the following steps. The anode electrode is formed in such a way to electrically couple one or more contacted anode regions of said anode regions with the anode electrode on the anode surface. One or more floating anode regions of said anode regions are electrically insulated from the anode electrode. The diode is configured in such a way that charge carriers are injected from said at least one floating anode region into the drift region in response to the applying of a control voltage between the anode electrode and the cathode electrode exceeding a threshold voltage of the diode.

In general, similar considerations may be applied if the same solution is implemented by an equivalent method (using similar steps with the same functions of several steps or any portion thereof, by removing some non-essential steps, or adding additional optional steps); furthermore, the steps may be performed in a different order, in parallel or overlapped (at least in part).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diode integrated on a chip of semiconductor material having an anode surface and a cathode surface opposite to each other, the diode comprising:
   a cathode region having a doping of a first type, the cathode region extending from the cathode surface in the chip,
   a drift region having a doping of the first type with a dopant concentration lower than a dopant concentration of the cathode region, the drift region extending between the anode surface and the cathode region,
   a plurality of anode regions having a doping of a second type, each anode region extending from the anode surface in the drift region,
   a cathode electrode of electrically conductive material on the cathode surface and electrically coupled with said cathode region, and
   an anode electrode of electrically conducting material, wherein:
      the anode regions are positioned between the anode electrode and the cathode electrode;
      one or more contacted anode regions of said anode regions are electrically coupled with the anode electrode on the anode surface;
      one or more floating anode regions of said anode regions are electrically insulated from the anode electrode;
      the one or more floating anode regions are configured so that charge carriers are injected from said one or more floating anode regions into the drift region in response to a control voltage, applied between the anode electrode and the cathode electrode, exceeding a threshold voltage of the diode;
      the anode regions are arranged in a matrix on the anode surface; and
      the floating anode regions are organized into sets each of one or more floating anode regions, each set of floating anode regions being positioned at the anode surface between a respective pair of the contacted anode regions, and each set of one or more floating anode regions being separated from the respective pair of the contacted anode region by portions of the drift region.

2. The diode according to claim 1, wherein the drift region comprises a plurality of charge recombination centers adapted to recombine free charge carriers.

3. The diode according to claim 1, comprising an insulating layer covering the one or more floating anode regions and covering portions of the anode surface between the anode regions.

4. The diode according to claim 3, wherein the insulating layer includes one or more openings directly above the one or more contacted anode regions, respectively, and the anode electrode includes a covering portion that covers the insulating layer and one or more contact portions extending respectively in the one or more openings and contacting the one or more contacted anode regions, respectively.

5. The diode according to claim 4, wherein the insulating layer contacts all of the anode surface between consecutive ones of the one or more contacted anode regions.

6. The diode according to claim 1, wherein the floating anode regions are organized into sets each of one or more floating anode regions, each set of floating anode regions being surrounded along a plurality of directions at the anode surface by a plurality of the contacted anode regions.

7. The diode according to claim 1, in which the contacted anode regions and the floating anode regions are arranged at the anode surface along corresponding alignments parallel to each other, the alignments of the floating anode regions being arranged in sets each of one or more alignments, each set of alignments of the floating anode regions at the anode surface being positioned between each pair of adjacent alignments of the contacted anode regions.

8. An electronic device comprising:
   a power transistor integrated on a chip of semiconductor material having an anode surface and a cathode surface opposite to each other; and
   a diode operatively coupled with the power transistor, the diode including:
      a cathode region having a doping of a first type, the cathode region extending from the cathode surface in the chip,
      a drift region having a doping of the first type with a dopant concentration lower than a dopant concentration of the cathode region, the drift region extending between the anode surface and the cathode region,
      a plurality of anode regions having a doping of a second type, each anode region extending from the anode surface in the drift region,
      a cathode electrode of electrically conductive material on the cathode surface and electrically coupled with said cathode region, and
      an anode electrode of electrically conducting material, wherein:
         the anode regions are positioned between the anode electrode and the cathode electrode;
         one or more contacted anode regions of said anode regions are electrically coupled with the anode electrode on the anode surface, and one or more floating anode regions of said anode regions are electrically insulated from the anode electrode, the one or more floating anode regions are configured so that charge carriers are injected from said one or more floating anode regions into the drift region in response to a control voltage, applied between the anode electrode and the cathode electrode, exceeding a threshold voltage of the diode, wherein the anode regions are arranged in a matrix at the anode surface, and the one or more floating anode regions are organized into sets each of one or more floating anode regions, each set of one or more floating anode regions being positioned at the anode surface between a respective pair of the contacted anode regions, and each set of one or more floating anode regions being separated from the respective pair of the contacted anode region by portions of the drift region.

9. The electronic device according to claim 8, wherein the diode includes an insulating layer covering the one or more floating anode regions and covering portions of the anode surface between the anode regions.

10. The electronic device according to claim 9, wherein the insulating layer includes one or more openings directly above the one or more contacted anode regions, respectively, and the anode electrode includes a covering portion that covers the insulating layer and one or more contact portions extending respectively in the one or more openings and contacting the one or more contacted anode regions, respectively.

11. The electronic device according to claim 10, wherein the insulating layer contacts all of the anode surface between consecutive ones of the one or more contacted anode regions.

12. The electronic device according to claim 8, wherein the floating anode regions are organized into sets each of one or more floating anode regions, each set of one or more floating anode regions being surrounded along a plurality of directions at the anode surface by a plurality of the contacted anode regions.

13. The electronic device according to claim 8, in which the contacted anode regions and the floating anode regions are arranged at the anode surface along corresponding alignments parallel to each other, the alignments of the floating anode regions being arranged in sets each of one or more alignments, each set of alignments of the floating anode regions at the anode surface being positioned between each pair of adjacent alignments of the contacted anode regions.

14. The electronic device according to claim 8, wherein the electronic device is a power apparatus configured to supply power to a load.

15. A method, comprising:

integrating a diode in a chip of semiconductor material having an anode surface and a cathode surface opposite to each other, the integrating including:

forming a cathode region having a doping of a first type, the cathode region extending from the cathode surface in the chip thereby defining a drift region having a doping of the first type with a dopant concentration lower than a dopant concentration of the cathode region, the drift region extending between the anode surface and the cathode region, forming a plurality of anode regions having a doping of a second type, each anode region extending from the anode surface in the drift region, forming a cathode electrode of electrically conductive material on the cathode surface and electrically coupled with the cathode region, and forming an anode electrode of electrically conducting material, wherein:

forming the plurality of anode regions includes positioning the anode regions between the anode electrode and the cathode electrode;

forming the anode electrode comprises:

forming the anode electrode in such a way to electrically couple one or more contacted anode regions of said anode regions with the anode electrode on the anode surface, and electrically insulating one or more floating anode regions of said anode regions from the anode electrode, the one or more floating anode regions are configured in such a way that charge carriers are injected from said at least one floating anode region into the drift region in response to a control voltage, applied between the anode electrode and the cathode electrode, exceeding a threshold voltage of the diode, the anode regions are arranged in a matrix at the anode surface, and the one or more floating anode regions are organized into sets each of one or more floating anode regions, each set of one or more floating anode regions being positioned at the anode surface between a respective pair of the contacted anode regions, and each set of one or more floating anode regions being separated from the respective pair of the contacted anode region by portions of the drift region.

16. The method according to claim 15, comprising forming an insulating layer covering the one or more floating anode regions and covering portions of the anode surface between the anode regions.

17. The method according to claim 16, wherein the insulating layer includes one or more openings directly above the one or more contacted anode regions, respectively, and the anode electrode includes a covering portion that covers the insulating layer and one or more contact portions extending respectively in the one or more openings and contacting the one or more contacted anode regions, respectively.

18. The method according to claim 17, wherein the insulating layer contacts all of the anode surface between consecutive ones of the one or more contacted anode regions.

19. The method according to claim 18, wherein the floating anode regions are organized into sets each of one or more floating anode regions, each set of one or more floating anode regions being surrounded along a plurality of directions at the anode surface by a plurality of the contacted anode regions.

20. The method according to claim 18, in which the contacted anode regions and the floating anode regions are arranged at the anode surface along corresponding alignments parallel to each other, the alignments of the floating anode regions being arranged in sets each of one or more alignments, each set of alignments of the floating anode regions at the anode surface being positioned between each pair of adjacent alignments of the contacted anode regions.

* * * * *